(12) United States Patent
Hayashi et al.

(10) Patent No.: US 7,026,712 B2
(45) Date of Patent: Apr. 11, 2006

(54) PELTIER MODULE WITH DURABLE POWER SUPPLY LINES AND EXOTHERMIC MODULE WITH BUILT-IN COOLER

(75) Inventors: Takahiro Hayashi, Shizuoka (JP); Kenzaburou Iijima, Shizuoka (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 10/436,165

(22) Filed: May 13, 2003

(65) Prior Publication Data

US 2003/0193087 A1    Oct. 16, 2003

Related U.S. Application Data

(63) Continuation of application No. 09/537,527, filed on Mar. 29, 2000, now abandoned.

(30) Foreign Application Priority Data

Apr. 1, 1999    (JP) .................................. 11-95573

(51) Int. Cl.
*H01L 23/34*    (2006.01)
(52) U.S. Cl. ..................................... 257/712

(58) Field of Classification Search ................ 257/412, 257/712, 467–470
See application file for complete search history.

(56) References Cited

U.S. PATENT DOCUMENTS 5,760,419 A * 6/1998 Nabiev et al. ................. 257/21

FOREIGN PATENT DOCUMENTS

| JP | 05243621 | * | 2/1992 |
| JP | 05243621 A | * | 9/1993 |

* cited by examiner

*Primary Examiner*—Leonardo Andujar
(74) *Attorney, Agent, or Firm*—Dickstein, Shapiro, Morin & Oshinsky, LLP.

(57) ABSTRACT

A Peltier module is appropriate to a cooler incorporated in an optical communication module, and includes a series of Peltier junctions sandwiched between two substrates and power supply electrodes respectively connected to the outermost Peltier junctions, wherein the power supply electrodes pass through hollow spaces formed in one of the substrates so that conductive wires approach the contact areas in the upper surfaces of the power supply electrodes through the hollow space without a sharp bend.

23 Claims, 11 Drawing Sheets

PELTIER MODULE WITH DURABLE POWER SUPPLY LINES AND EXOTHERMIC MODULE WITH BUILT-IN COOLER

This is a Continuation Application of U.S. patent application Ser. No. 09/537,527 filed Mar. 29, 2000 now abandoned.

FIELD OF THE INVENTION

The invention relates to a Peltier module and, more particularly, to a Peltier module with power supply lines and an exothermic module with a built-in cooler implemented by the Peltier element.

DESCRIPTION OF THE RELATED ART

The Peltier module is a thermoelectric converter. Larger temperature differences are produced with metal-semiconductor junctions than with metal-metal junctions. A metal-n-type semiconductor junction produces a temperature difference in the opposite sense to that of a metal-p-type semiconductor junction for the same direction of current flow. For this reason, a typical example of the Peltier module includes the metal-n-type semiconductor junctions and the metal-n-type semiconductor junctions alternately connected in series.

The Peltier module is appropriate to a cooling system for an exothermic module such as, for example, an optical communication module. The optical communication module is associated with an electric power source, and electric current is supplied from the electric power source to the Peltier module. The metal-semiconductor junctions serve as a cooling element, and cools the associated electric/electronic module or the optical communication module.

FIG. 1 illustrates the prior art Peltier module. The prior art Peltier module has pieces of semiconductor 1a and 1b, metal electrodes 2, a pair of substrates 3a/3b and a pair of power supply leads 4. The semiconductor for the pieces 1a are opposite in conductivity type to the semiconductor for the pieces 1b, and the pieces of semiconductor 1a are alternated with the remaining pieces of semiconductor 1b. Although the substrates 3a/3b are electrically insulating, they are thermally conductive. The pieces of semiconductor 1a/1b are hatched. On the other hand, the metal electrodes 2 are blacked up. Thus, the pieces of semiconductor 1a/1b are distinguishable from the metal electrodes in FIGS. 1 and 2.

The metal electrodes 2 are patterned on the substrates 3a/3b, and are held in contact with the end surfaces of the pieces of semiconductor 1a and 1b. The pieces of semiconductor 1a/1b and the metal electrodes 2 form Peltier junctions. The Peltier junctions are connected in series between the outermost metal electrodes 2a.

The series of Peltier junctions is sandwiched between the substrates 3a/3b. In this instance, the pieces of semiconductor 1a are n-type, and the upper substrate 3a and the lower substrate 3b serves as the cold side and the hot side, respectively. The power supply leads 4 are soldered to the outermost metal electrodes 2a on the lower substrate 3b. Electric current flows through the series of Peltier junctions as indicated by arrow AR1, and the Peltier junctions produce a temperature difference between the substrates 3a and 3b.

The prior art Peltier module is available for an optical communication module. FIG. 2 illustrates an optical communication module with a built-in cooler. The cooler is implemented by the Peltier module. The upper substrate 3a is shared between the Peltier module and the optical communication module. Optical devices are mounted on the substrate 3a. One of the optical devices is a laser emitting diode, which is labeled with reference numeral 7. The power supply lead 4 is bent three times, and is taken out from the narrow space around the prior art Peltier module. Though not shown in the figure, the power supply lead 4 is connected to an electric power source, and supplies electric current to the series of Peltier junctions.

While the optical communication module is operating, the laser emitting diode generates laser light and heat. Thus, the optical communication module is an exothermic module. The heat is propagated through the upper substrate 3a. The power supply line 4 flows electric current through the pieces of Peltier junctions to the other power supply line (not shown), and the Peltier junctions absorbs the heat.

A problem is encountered in the prior art Peltier module in the durability. The power supply lines 4 are liable to be separated from the outermost metal electrodes 2a with the result that the prior art Peltier module will absorb the heat from the optical communication module. This results in damage to the optical communication module.

Another problem inherent in the prior art Peltier module is inefficient assembling work. In the fabrication of the optical communication module, an assembling worker manually solders the power supply leads 4 to the outermost metal electrodes 3b, and bends the power supply leads 4 three times. This is time-consuming work and the manufacturer suffers from a low throughput in the assembling work.

SUMMARY OF THE INVENTION

It is therefore an important object of the present invention to provide a Peltier module, which is durable and reliable.

It is also an important object of the present invention to provide an exothermic module with a built-in cooler implemented by the Peltier element, which a manufacturer assembles with the exothermic module at a high throughput.

The present inventors contemplated the problems inherent in the prior art Peltier module and the prior art communication module. The present inventor noticed that the bending moment was exerted on the piece of solder when the worker upwardly directed the power supply line. Thermal stress was repeatedly exerted on the piece of solder between the outermost electrode and the power supply line, and might grow the crack. In fact, crack was found in the piece of solder during the assembling work, and the power supply line was separated from the outermost electrode. Even if the power supply line was not separated from the outermost electrode, the crack might be grown through the repetition of the thermal stress. The present inventor concluded that the bend of the power supply line gave rise to the separation between the power supply line 4 and the outermost metal electrode 2a.

The present inventors further investigated the assembling work, and noticed that the upper substrate 3a was an obstacle against the assembling tool. The power supply lines 4 were soldered to the outermost metal electrodes 2a patterned on the lower substrate 3b. The outermost electrodes 2a were under the shade of the upper substrate 3a, and tool was allowed to access the outermost electrodes 2a from the space around the pieces of semiconductor 1a/1b. For this reason, the assembling worker determined the leading end of the power supply line 4 on the outermost electrodes 2a with the eyes, and stretched his arm so as to put the soldering tool onto the leading end of the power supply line 4. The present inventors concluded that the access space was too narrow to enhance the assembling work.

To accomplish the object, the present invention proposes to expose an outermost metal electrode on a substrate to space outside of the other substrate.

In accordance with one aspect of the present invention, there is provided a Peltier module comprising a first substrate having a first inner surface and a first outer surface, a second substrate having a second inner surface opposed to the first inner surface and a second outer surface and defining hollow spaces opposite to plural areas of the first inner surface, plural Peltier junctions formed between pieces of semiconductor and metal electrodes selectively formed on the first inner surface and the second inner surface and connected in series between certain metal electrodes selected from the metal electrodes and plural power supply electrodes respectively held in contact with the certain metal electrodes and having contact areas aligned with the hollow spaces, respectively, so that power supply lines approach the contact areas through the hollow spaces.

In accordance with another aspect of the present invention, there is provided an exothermic module comprising at least one circuit component generating heat while the exothermic module is operating, plural sources of electric power having respective potential levels different from one another, a cooler including a first substrate having a first inner surface and a first outer surface, a second substrate having a second inner surface opposed to the first inner surface and a second outer surface for supporting the at least one circuit component, closer to the plural sources than the first substrate and defining hollow spaces opposite to plural areas of the first inner surface and offset from the plural sources of electric power, plural Peltier junctions formed between pieces of semiconductor and metal electrodes selectively formed on the first inner surface and the second inner surface and connected in series between certain metal electrodes selected from the metal electrodes and plural power supply electrodes respectively held in contact with the certain metal electrodes and having respective contact areas aligned with the hollow spaces, respectively, and conductive wires connected between the plural sources of electric power and the respective contact areas through the hollow spaces, respectively.

BRIEF DESCRIPTION OF THE DRAWINGS

The features and advantages of the Peltier module and an optical exothermic module will be more clearly understood from the following description taken in conjunction with the accompanying drawings in which.

DESCRIPTION OF THE PREFERRED EMBODIMENTS

First Embodiment

Figure 1:
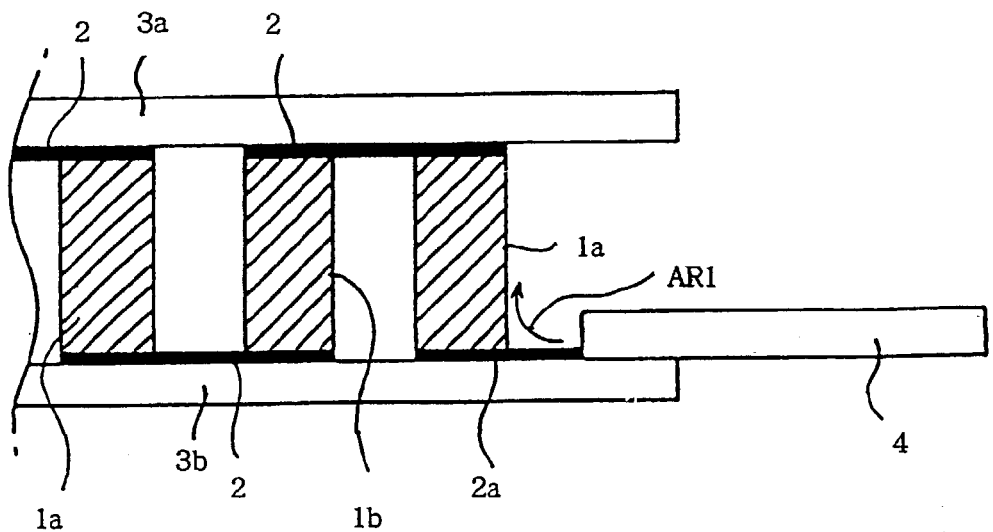
FIG. 1 is a front view showing the structure of the prior art Peltier module.
Figure 2:
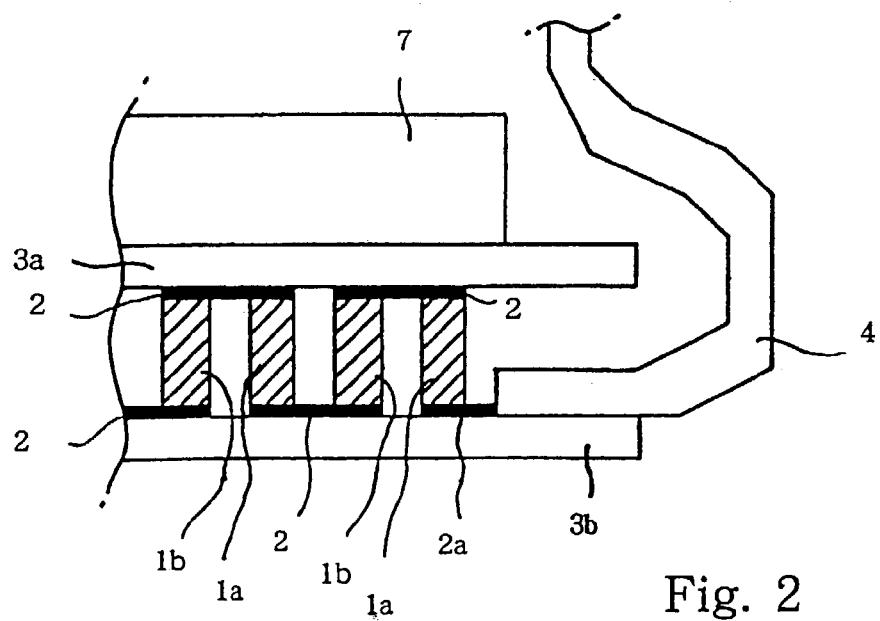
FIG. 2 is a side view showing the prior art Peltier module incorporated in the optical communication module.
Figure 3:
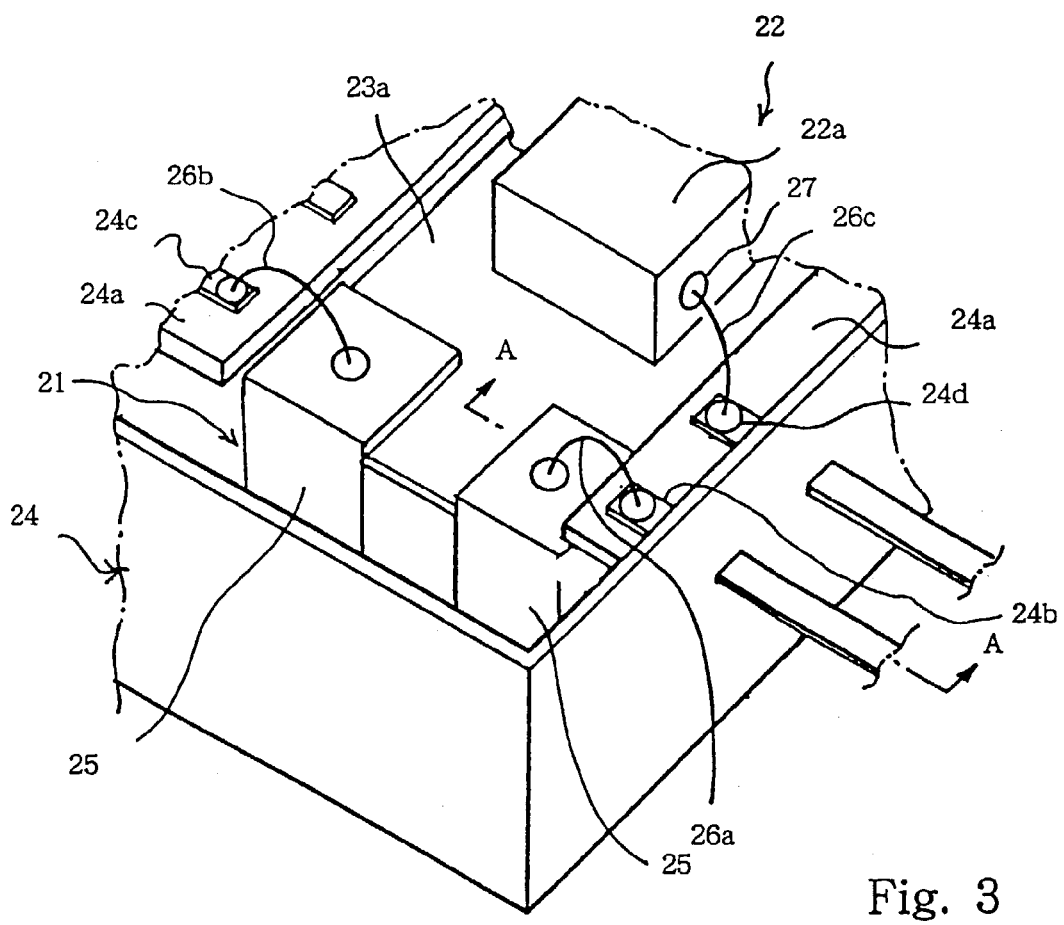
FIG. 3 is a perspective view showing an optical communication module with a built-in cooler according to the present invention.
Figure 4:
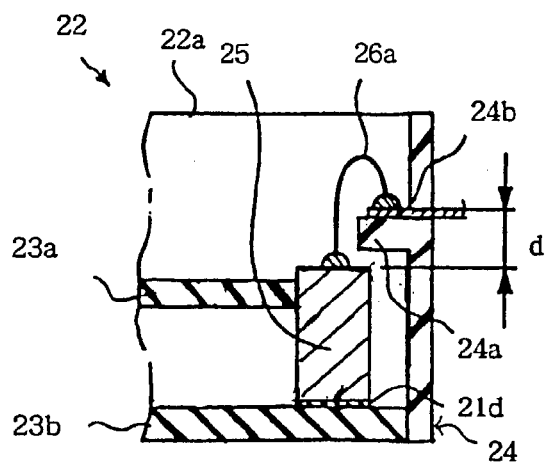
FIG. 4 is a cross sectional view taken along line A—A of FIG. 3 and showing the conductive wire connected between a power supply electrode and a metal electrode of a Peltier element.

Referring to FIGS. 3, 4, 5 and 6 of the drawings, an optical communication module equipped with a built-in cooler embodying the present invention comprises a Peltier element 21, optical elements 22, a pair of substrates 23a/23b, a casing 24 and power supply electrodes 25. The substrates 23a/23b are electrically insulating and thermally conductive, and the upper substrate 23a is shared between the Peltier element 21 and the optical elements 22. One of the optical elements is a laser emitting device 22a, and is mounted on the upper substrate 23a. The lower substrate 23b is arranged in parallel to the upper substrate 23a, and the Peltier element 21 is sandwiched between the lower substrate 23b and the upper substrate 23a. As will be better understood from FIG. 7, two corners of the upper substrate 23a are cut away. Thus, the upper substrate 23a offers two free passages to the power supply electrodes 25. The power supply electrodes 25 project through the free passages over the upper substrate 23a.

Figure 5:
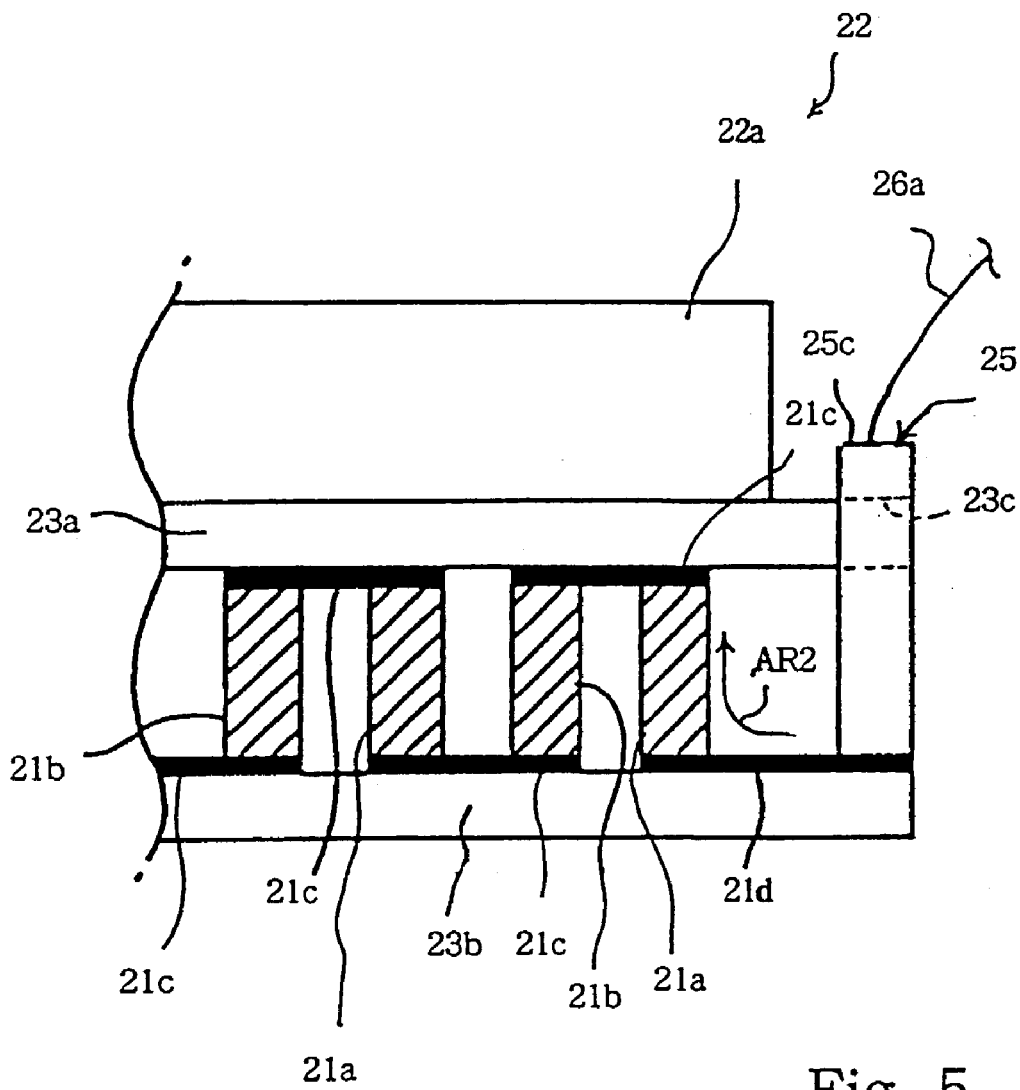
FIG. 5 is a side view showing the structure of the optical communication module with the built-in cooler.
Figure 6:
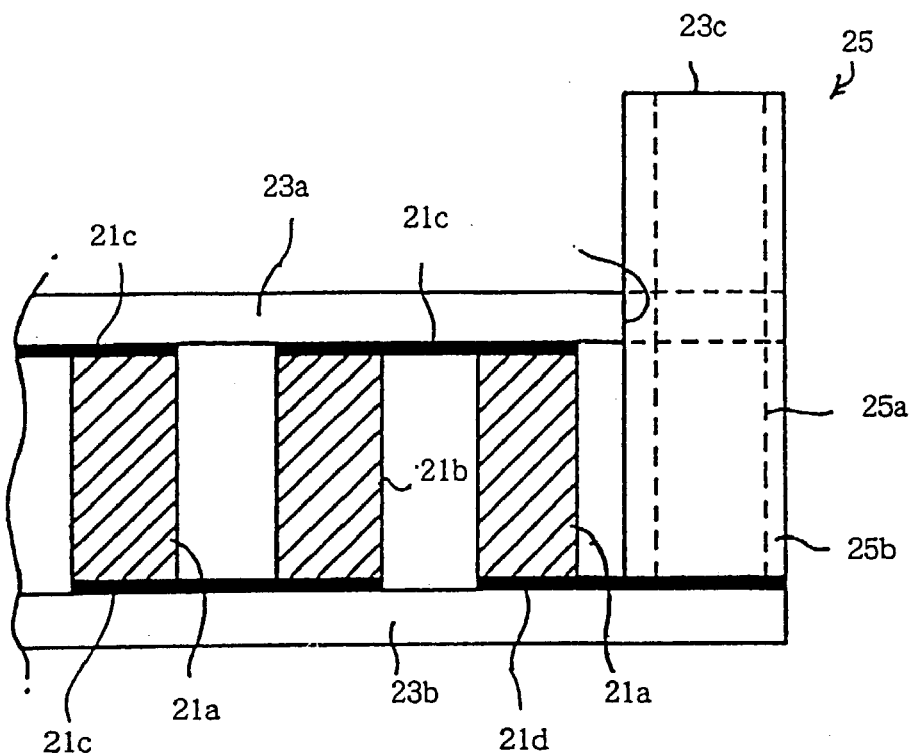
FIG. 6 is a side view showing a part of the Peltier element magnified for better understanding.

Turning black to FIGS. 3 to 6, the Peltier element 21 includes pieces of n-type semiconductor 21a, pieces of p-type semiconductor 21b and metal electrodes 21c/21d. The pieces of n-type semiconductor 21a are altered with the pieces of p-type semiconductor 21b. The metal electrodes 21c/21d are formed on the inner surfaces of the upper/lower substrates 23a/23b at intervals, and are arranged in staggered fashion. The pieces of n-type/p-type semiconductor 21a/21b are connected between the metal electrodes 21d/21c on the lower substrate 23b and the metal electrodes 21c on the upper substrate 23a. The pieces of n-type/p-type semiconductor 21a/21b and the metal electrodes 21c/21d form Peltier junctions therebetween, and the Peltier junctions are connected in series between the metal electrode 21d and another metal electrode (not shown). In FIGS. 5 and 6, the pieces of n-type/p-type semiconductor 21a/21b are hatched, and the metal electrodes 21c/21d are blacked up. The hatching lines does not indicate any cross section, but make the pieces of n-type/p-type semiconductor 21a/21b distinguishable from the metal electrodes 21c/21d.

The metal electrodes 21d are outwardly prolonged, and the power supply electrodes 25 are held in contact with the extensions of the metal electrodes 21d, respectively. Electric current flows through the series of Peltier junctions as indicated by arrow AR2, and the Peltier junctions produce a temperature difference. In this instance, the upper substrate 23a and the lower substrate 23b serve as a cold side and a hot side, respectively.

The casing 24 has eaves 24a inwardly projecting from the side walls of the casing 24. The eaves 24a extend over the upper substrate 23a, and conductive strips 24b/24c/24d are patterned on the eaves 24a. The conductive strips 24b/24c/24d are regulated to predetermined potential levels. The conductive strip 24b has a positive potential level, and the conductive strip 24b has a certain potential level lower than the positive potential level.

Figure 7:
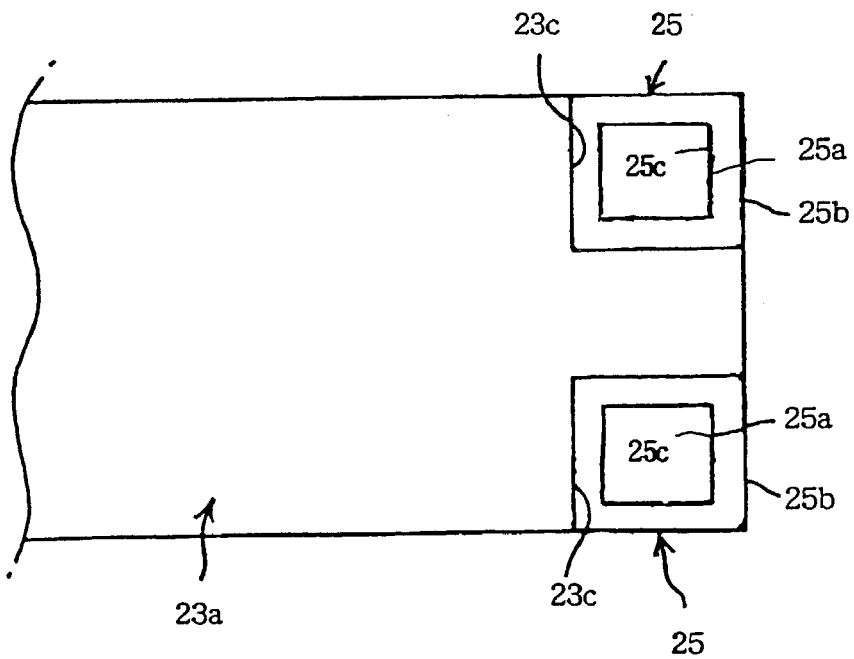
FIG. 7 is a plane view showing the part of the Peltier element shown in FIG. 6.

The power supply electrode 25 has a conductive pole 25a and a heat insulating layer 25b. The conductive pole 25a is a rectangular column, and is conformably covered with the heat insulating layer 25b. The power supply electrodes 25 have a rectangular column configuration, and are snugly received in the cut-off portions 23c of the upper substrate 23a as shown in FIG. 7. The conductive poles 25a have a laminated structure. Core is, by way of example, formed of copper, copper-tungsten alloy or aluminum, and is covered with a nickel layer and a gold layer. The nickel layer is of the order of 2 microns thick, and the gold layer is as thin as 0.05 micron thick. On the other hand, the heat insulating layer 25b is, by way of example, formed of aluminum oxide expressed as $Al_2O_3$ or silicon oxide expressed as $SiO_2$. These materials do not set a limitation on the present invention. The heat insulating layers 25b are desirable. Although the heat is propagated from the lower substrate 23b through the conductive pole 25a toward the upper substrate 23a, the heat insulating layers 25b prevent the upper substrate 23a serving as the cold side from the heat, and the Peltier module achieves a high heat efficiency. The upper surface 25c may be covered with the heat insulating layer 25b except the contact area to the conductive wire 26a/26b. The heat insulating layer on the upper surface 25 enhances the heat efficiency.

The power supply electrodes 25 are upright on the metal electrodes 21d, and the upper surfaces 25c thereof exceed the outer surface of the upper substrate 23a. The power supply electrodes 25 are held in contact with the upper substrate 23a, and the upper substrate 23a prevents the contact portion between the power supply electrodes 25 and the metal electrodes 21d from large bending moment. The upper surfaces 25c of the power supply electrodes 25 are close to the conductive strips 24b/24c, and the distance d (FIG. 4) between the upper surfaces 25c and the conductive strips 24b/24c is regulated in such a manner that the manufacturer easily carries out the wire bonding. In this example, the distance d is ±3 mm. Conductive wires 26a/26b/26c are selectively connected between the conductive strips 24b/24c/24d and the electrodes/terminals 25/27.

The conductive wires 26a/26b/26c are bonded between the conductive strips 24b/24c/24d and the electrodes/terminals 25/25/27, respectively, by using a wire bonding apparatus (not shown). The wire bonding apparatus may have a capillary three-dimensionally movable over the optical communication module. A bonding wire (not shown) passes through the capillary, and the leading end of the conductive wire projects from the lower end of the capillary. The bonding wire is well known to person skilled in the art. The bonding wire may be formed of aluminum or gold.

The conductive wire 26a is connected between the conductive strip 24b and the power supply electrode 25 as follows. The capillary is downwardly moved, and presses the leading end of the bonding wire against the conductive strip 24b. Intermetallic phase is produced between the bonding wire and the conductive strip 24b, and the leading end of the bonding wire is strongly fixed to the conductive strip 24b/24c/24d. Then, the capillary is upwardly moved without grasping the bonding wire, and is further moved to the space over the electrode 25. The capillary grasps the bonding wire, again, and is downwardly moved toward the power supply electrode 25. The capillary presses the bonding wire against the power supply electrode 25, and intermetallic phase is produced between the bonding wire and the power supply electrode 25. The capillary is upwardly moved without grasping the bonding wire by a short length, and grasps the bonding wire, again. The capillary is upwardly moved, and breaks the bonding wire. Thus, the part of the bonding wire is left between the conductive strip 24b and the power supply electrode 25, and serves as the conductive wire 26a.

The intermatallic phase is much stronger than the solder piece, and the conductive wires 26a/26b/26c are hardly separated from the electrodes/terminals 25/25/27. The wire bonding apparatus automatically connects the conductive wires 26a/26b between the conductive strips 24b/24c and the power supply electrodes 25, and enhances the productivity of the optical communication module with the built-in cooler.

The optical communication module with the built-in cooler is fabricated as follows. First, the metal electrodes 21c/21d are attached to the pieces of semiconductor 21a/21b and the power supply electrodes 25. The pieces of semiconductor 21a/21b are connected in series through the metal electrodes 21c between the metal electrodes 21d.

Figure 8:
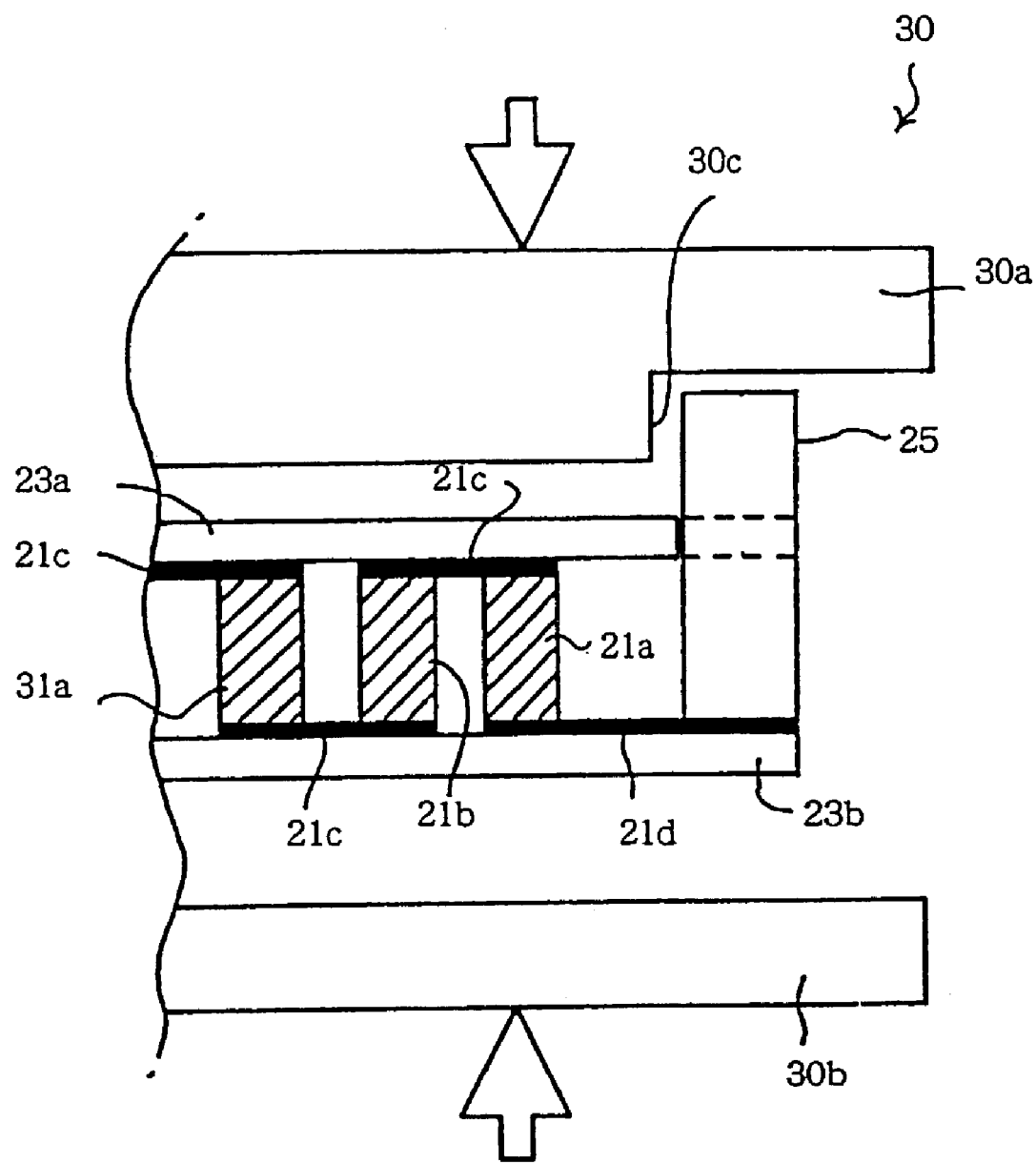
FIG. 8 is a side view showing an assembling step of a process for fabricating the optical communication module.

Subsequently, a tool 30 is prepared, and the upper tool block 30a is separated from the lower tool block 30b. The upper substrate 23a and the lower substrate 23b are retained by the upper tool block 30a and the lower tool block 30b, respectively, and the power supply electrodes 25 are also retained by the upper tool block 30a. The metal electrodes 21c/21d attached to the pieces of semiconductor 21a/21b are inserted into the gap between the upper tool block 30a and the lower tool block 30b. The tool 30 is closed, and the metal electrodes 21c/21d are bonded to the inner surfaces of the upper/lower substrates 23a/23b, respectively, and the power supply electrodes 25 are bonded to the metal electrodes 21d as shown in FIG. 8. The inner surface of the upper tool block 30a is partially depressed as indicated by reference 30c, and the power supply electrodes 25 are retained in the depressed portions. Thus, the upper/lower substrates 23a/23b and the power supply electrodes 25 are concurrently bonded to the metal electrodes 21c/21d. The resultant structure is taken out from the tool 30, and is a Peltier module serving as the cooler incorporated in the optical communication module. The optical devices may be mounted on the outer surface of the upper substrate 23a.

Subsequently, the resultant structure is placed inside the casing 24. The upper surfaces 25c of the power supply electrodes 25 and the conductive strips 24b/24c are exposed to the capillary. For this reason, the wire bonding apparatus automatically connects the conductive strips 24b/24c to the upper surfaces 25c of the power supply electrodes 25. Thus, the wire bonding apparatus is available for the Peltier module according to the present invention, and the assembling work is speed-up. This results in a high throughput in the assembling stage. The intermetallic phase takes place between the conductive strips 24b/24c and the conductive wires 26a/26b, and is much stronger than the solder. For this reason, the conductive wires 26a/26b are hardly separated from the conductive strips 24b/24c and the power supply electrodes 25.

There is not any obstacle over the power supply electrodes 25, and the conductive wires 26a/26b is naturally curved between the conductive strips 24b/24c and the upper surfaces 25c. It is not necessary to sidewardly access to the power supply electrodes. This results in that an assembling worker does not manually bend the conductive wire. Any large force is not exerted on the contact portions of the wires 26a/26b. Thus, the conductive wires 26a/26b are free from the crack. Moreover, the conductive wires 26a/26b occupy the space over the Peltier module, and do not sidewardly project. Thus, the Peltier module according to the present invention is compact, and merely occupies relatively narrow space in the casing 24.

In the first embodiment, the lower substrate 23b and the upper substrate 23a serve as a first substrate and a second substrate, respectively, and the cutoff portions 23c define hollow spaces. The metal electrodes 21d serve as certain metal electrodes.

Second Embodiment

Figure 9:
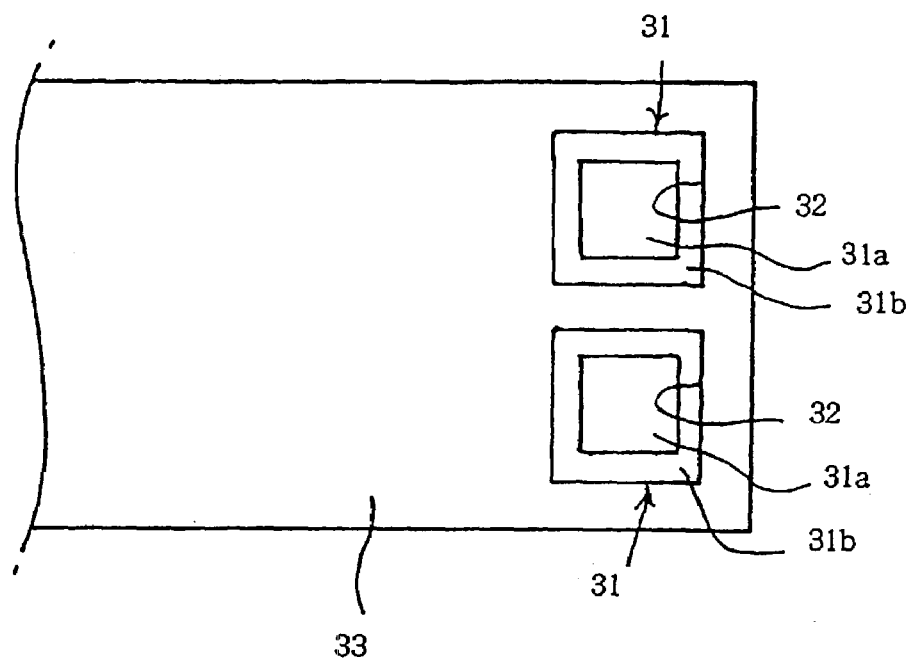
FIG. 9 is a plane view showing another Peltier module according to the present invention.

Turning to FIG. 9 of the drawings, another Peltier module embodying the present invention has power supply electrodes 31, which upwardly project through rectangular holes 32 formed in an upper substrate 33. The power supply electrodes 31 have the same structure as the power supply electrodes 25. A conductive pole 31a is covered with a heat insulating layer 31b. The other features of the Peltier module implementing the second embodiment are similar to those of the first embodiment, and no further description is incorporated hereinbelow for the sake of simplicity.

The Peltier module forms a part of an optical communication module, and serves as a cooler. The Peltier module and the optical communication module with a built-in cooler achieve all the advantages of the first embodiment. The upper substrate 33 prevents the power supply electrodes 31 from undesirable external force, and the power supply electrodes 31 are never inclined.

In this instance, the rectangular holes 32 are corresponding to the hollow spaces.

Third Embodiment

Figure 10:
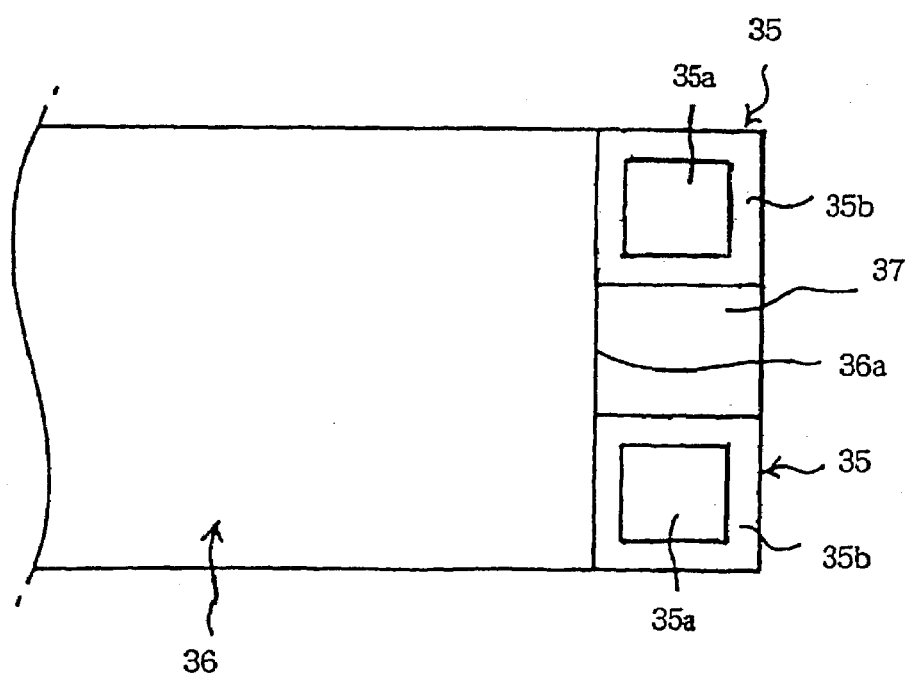
FIG. 10 is a plane view showing yet another Peltier module according to the present invention.

Turning to figure 10 of the drawings, yet another Peltier module embodying the present invention has power supply electrodes 35 held in contact with an end surface 36a of an upper substrate 36. The upper substrate 36 is shorter than a lower substrate 37. However, the upper substrate 36 keeps the corners as shown. In other words, any corner is not cut away. The upper substrate 36 is lower in machining cost than those of the first/second embodiments. The other features of the Peltier module implementing the third embodiment are similar to those of the first embodiment, and no further description is incorporated hereinbelow for the sake of simplicity. The power supply electrodes 35 also have conductive poles 35a and heat insulating layers 35b.

The Peltier module forms a part of an optical communication module, and serves as a cooler. The Peltier module and the optical communication module with a built-in cooler achieve all the advantages of the first embodiment.

In this instance, both side zones of the space outside the end surface 36a is corresponding to the hollow spaces.

Fourth Embodiment

Figure 11:
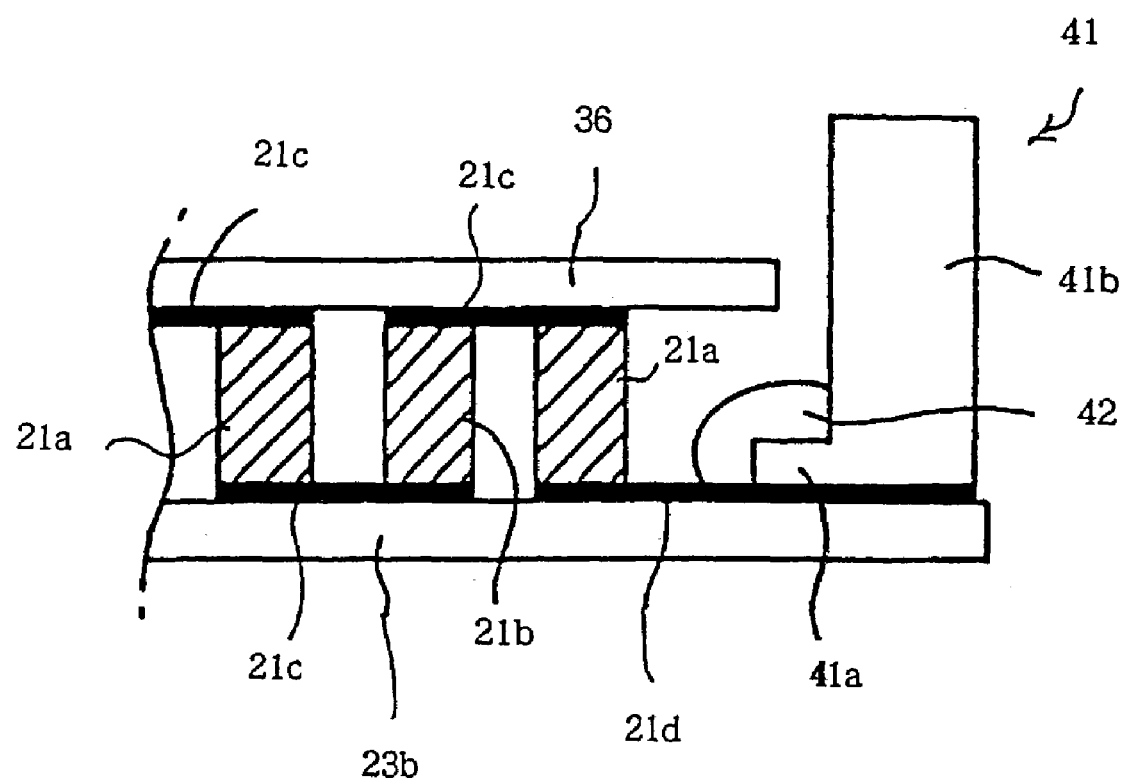
FIG. 11 is a side view showing still another Peltier module according to the present invention.

FIG. 11 illustrates still another Peltier module embodying the present invention. The Peltier module implementing the fourth embodiment is similar to the third embodiment except power supply electrodes 41. For this reason, description is focused on the power supply electrode 41, and other components are labeled with the same references designating corresponding components of the first/third embodiments without detailed description.

The power supply electrode 41 has a thick lower portion 41a and a thin upper portion 41b. The thick lower portion 41a is fixed to the metal electrode 21d by means of a piece of solder 42. The thin upper portion 41b is spaced from the upper substrate 36, and the gap enhances the heat insulation between the power supply electrode 41 and the upper substrate 36. When force is laterally exerted on the upper thin portion 41b, large bending moment is generated. However, the thick lower portion 41a and the solder piece 42 make the power supply electrode 41 to withstand the large moment.

Fifth Embodiment

Figure 12:
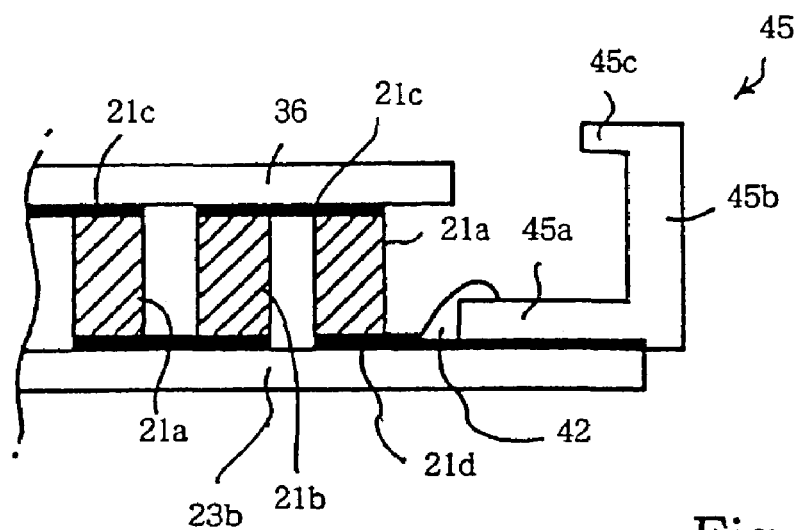
FIG. 12 is a plane view showing yet another Peltier module according to the present invention.

FIG. 12 illustrates yet another Peltier module embodying the present invention. The Peltier module implementing the fifth embodiment is similar to the third embodiment except power supply electrodes 45. For this reason, description is focused on the power supply electrode 45, and other components are labeled with the same references designating corresponding components of the first/third/fourth embodiments without detailed description.

The power supply electrode 45 has a lower portion 45a, an intermediate portion 45b and a contact portion 45c. The lower portion 45a is much thicker than the intermediate portion 45b, and the contact portion 45c offers wide area to the wire bonding apparatus. The lower portion 45a outwardly projects from the lower substrate 23b, and the intermediate portion 45b upwardly projects from the overhung portion of the lower portion 45a. This feature is desirable, because the extremely thin intermediate portion restricts the heat flow from the lower portion 45a toward the contact portion 45c. Moreover, the intermediate portion is widely spaced form the upper substrate 36. Thus, the power supply electrode 45 enhances the heat insulation.

The power supply electrodes 45 are fixed to the metal electrodes 21d by means of a piece of solder 42 after the assemblage of the upper/lower substrates 36/23b with the metal electrodes 21c attached to the pieces of semiconductor 21a/21b. An upper end portion of the intermediate portion 45b may be bent after soldering so as to form the contact portion 45c.

Sixth Embodiment

Figure 13:
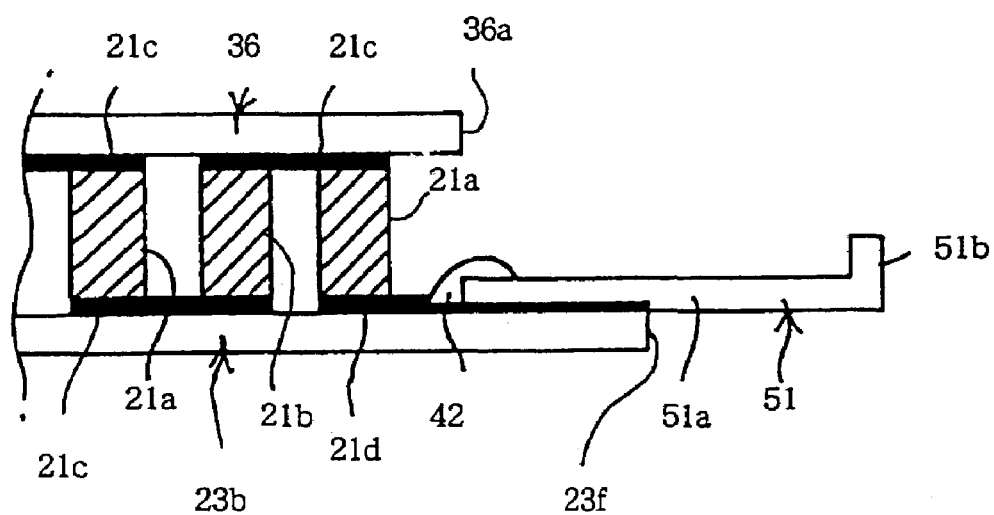
FIG. 13 is a side view showing still another Peltier module according to the present invention.

FIG. 13 illustrates still another Peltier module embodying the present invention. The Peltier module implementing the sixth embodiment is similar to the third embodiment except power supply electrodes 51. For this reason, description is focused on the power supply electrode 51, and other components are labeled with the same references designating corresponding components of the first/third/fourth embodiments without detailed description.

The power supply electrode 51 is soldered to the meal electrodes 21d, and sidewardly projects from the end surface 23f of the lower substrate 23b. Thus, the power supply electrode 51 has an over-hung portion 51a, and a contact portion 51b is upwardly projects from the leading end of the over-hung portion 51a. The contact portion 51b is lower than the upper substrate 36, and may be appropriate to a casing, which has an eaves 24a located between the lower substrate 23b and the upper substrate 36. Thus, the power supply electrode 51 is widely spaced from the cold side, and is less influential on the temperature of the upper substrate 36.

In this instance, the space on the left side of the end surface 36a offers hollow spaces to the power supply electrodes 51.

Seventh Embodiment

Figure 14:
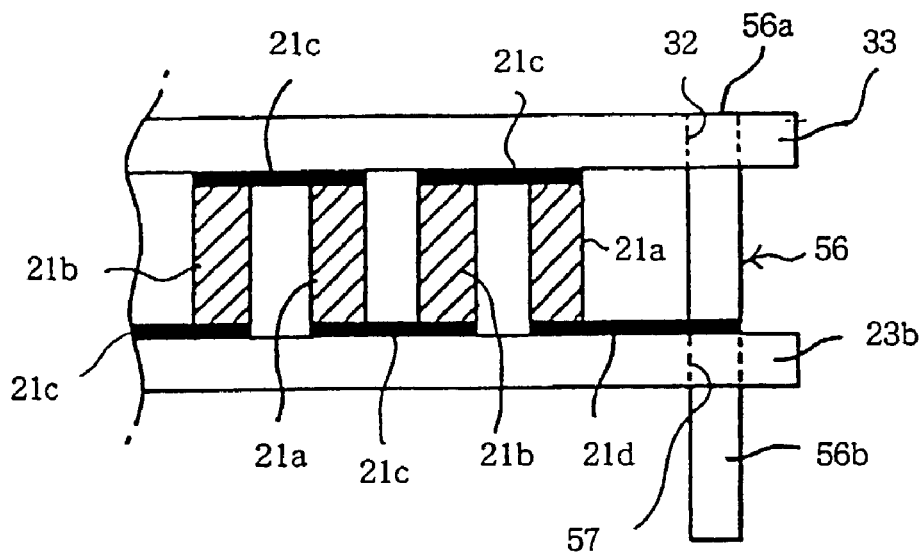
FIG. 14 is a plane view showing yet another Peltier module according to the present invention.

FIG. 14 illustrates yet another Peltier module embodying the present invention. The Peltier module implementing the seventh embodiment is similar to the second embodiment except power supply electrodes 56. For this reason, description is focused on the power supply electrode 56, and other components are labeled with the same references designating corresponding components of the first/second embodiments without detailed description.

The power supply electrodes 51 are inserted into the rectangular hole 32, and have contact surfaces 56a coplanar with the outer surface of the upper substrate 33. The lower substrate 23b is formed with rectangular holes 57, and the rectangular holes 57 are aligned with the rectangular holes 32, respectively. The power supply electrodes 56 further pass through the rectangular holes 57, and project from the outer surface of the lower substrate 23b. Thus, the power supply electrodes 56 have extensions 56b, which downwardly project from the outer surface of the lower substrate 23b. Although a heat insulating layer is inserted between the upper substrate 33 and the conductive column of the power supply electrodes 56, the lower substrate 23b is directly held in contact with the conductive column. The extensions 56b allow the lower substrate 23b to radiate the heat therethrough.

Eighth Embodiment

Figure 15:
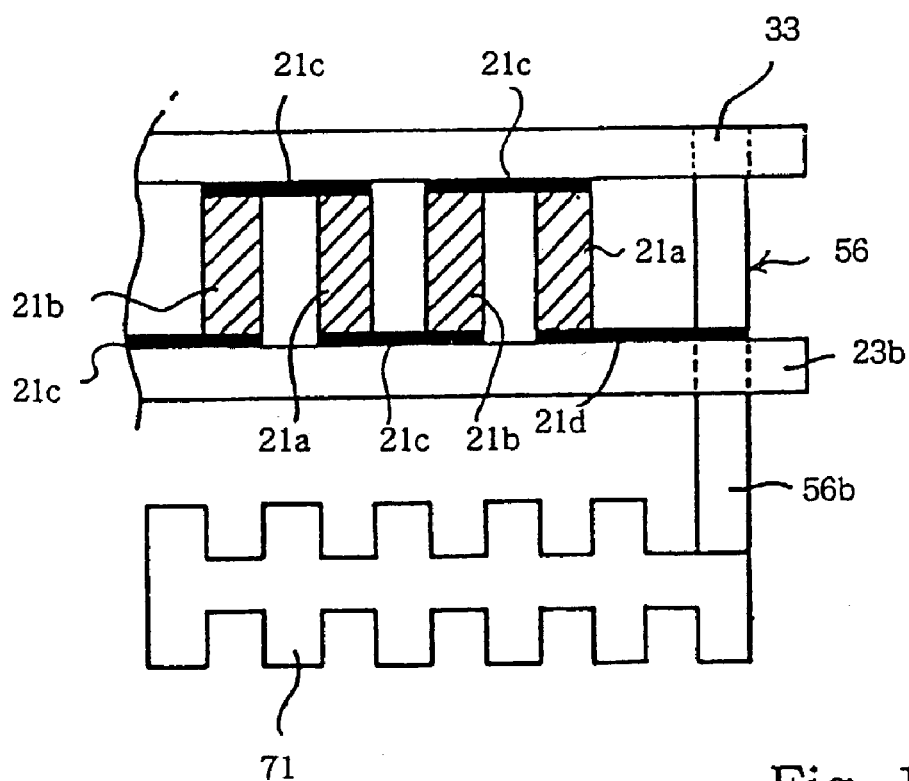
FIG. 15 is a side view showing still another Peltier module, according to the present invention.

FIG. 15 illustrates still another Peltier module embodying the present invention. The Peltier module implementing the eighth embodiment is similar to the seventh embodiment except fins 71. For this reason, description is focused on the fins 71, and other components are labeled with the same references designating corresponding components of the seventh embodiment without detailed description.

The fins 71 are integrated together, and the integrated fin structure 71 is connected to the lower end surface of the extensions 56b. The heat is propagated from the lower substrate 23b through the extensions 56b to the integrated fin structures 71, and are radiated from the integrated fin structure 71.

Ninth Embodiment

Figure 16:
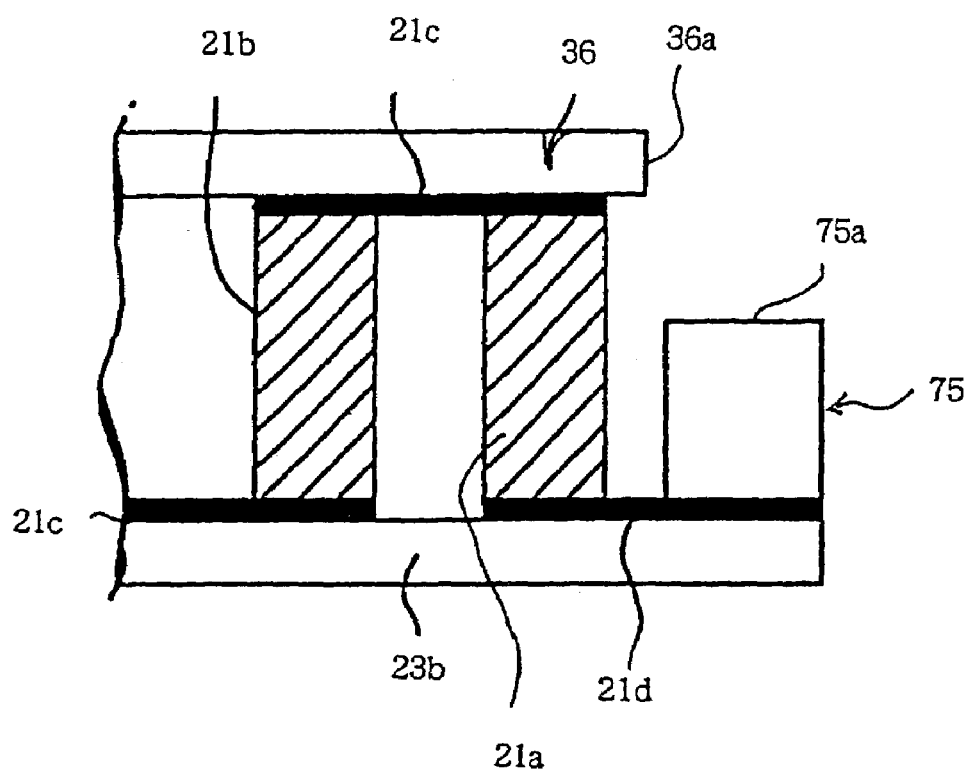
FIG. 16 is a plane view showing yet another Peltier module according to the present invention.

FIG. 16 illustrates yet another Peltier module embodying the present invention. The Peltier module implementing the ninth embodiment is similar to the third embodiment except power supply electrodes 75. For this reason, description is focused on the power supply electrodes 75, and other components are labeled with the same references designating corresponding components of the first/third embodiments without detailed description.

The power supply electrodes 75 are shorter than the pieces of semiconductor 21a/21b, and, accordingly, have contact surfaces 75a between the inner surface of the upper substrate 36 and the inner surface of the lower substrate 23b. When the optical communication module is accommodated in a casing, the eaves may be located between the upper substrate 36 and the lower substrate 23b. In this instance, the power supply electrodes 75 are appropriate to the optical communication module.

As will be appreciated from the foregoing description, the Peltier module according to the present invention has power supply electrodes with the contact surfaces exposed to the hollow space. This feature is desirable. Because, the conductive wires approach the contact surfaces through the hollow space without any sharp bend thereof. The conductive wires are not broken, and are durable. The manufacturer can wire the sources of electric power and the power supply electrodes by using a wire bonding apparatus. This results in the strong connection between the conductive wires and the power supply electrodes by virtue of the intermetallic phase produced therebetween. The conductive wires hardly peel off. Moreover, the wire bonding enhances the productivity, and the manufacturer reduces the production cost. Thus, the Peltier module according to the present invention is appropriate to a cooler incorporated in an exothermic module.

In the Peltier modules shown in FIGS. 3 to 10, 14 and 15, the power supply electrodes 25/31/35/56 project from one of the substrates, and are supported by the other substrate. The other substrates do not allow large bending moment to be exerted at the contacts between the power supply electrodes and one of the substrates, and enhance the stability of the power supply electrodes.

Although particular embodiments of the present invention have been shown and described, it will be apparent to those skilled in the art that various changes and modifications may be made without departing from the spirit and scope of the present invention.

The optical communication module is, by way of example, described as an application field of the Peltier module according to the present invention. The Peltier module may be used for any kind of exothermic module such as, for example, an electric module and an electronic module.

The power supply electrodes may have an insulating core pole formed of $Al_2O_3$ or $SiO_2$ coated with conductive material such as, for example, Cu, C—W alloy or Al, a nickel layer formed on the conductive material layer and a gold layer formed on the nickel layer.

The power supply electrodes may be directly held in contact with a conductive pattern on a rigid circuit board. In this instance, holes are formed in the bottom plate of the casing 24, and the lower substrate 23b is shorter than the upper substrate 23a. Power supply electrodes downwardly project from the metal electrodes 21d formed in the inner surface of the upper substrate 23a, and pass the hollow space outside of the end surface of the lower substrate 23b. The power supply electrodes further pass the holes, and downwardly project from the bottom plate of the casing 24. The casing 24 is provided over the rigid circuit board, and the power supply electrodes are connected to the conductive pattern formed on the upper surface of the rigid circuit board.

Figure 17:
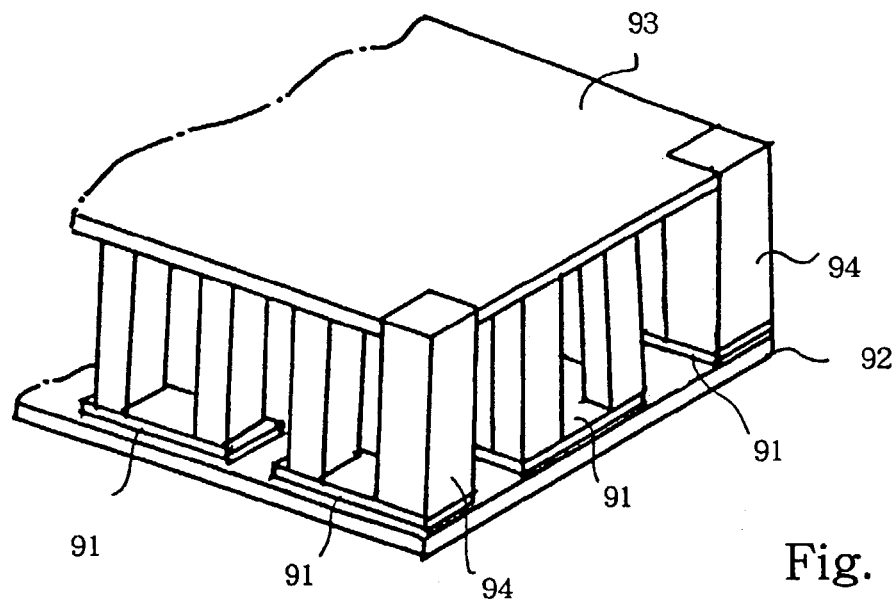
FIG. 17 is a perspective view showing a modification of the Peltier module according to the present invention.
Figure 18:
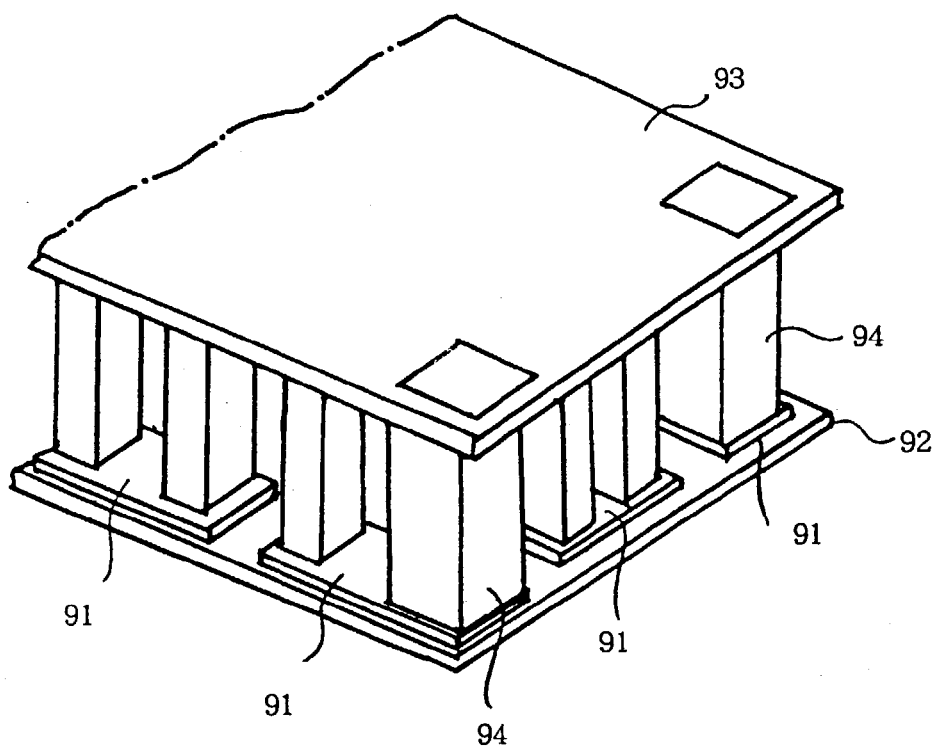
FIG. 18 is a perspective view showing another modification of the Peltier module according to the present invention.

The Peltier junctions may be arranged in more than two rows as shown in FIGS. 17 and 18. Metal electrodes 91 are, by way of example, formed in three columns on upper/lower substrates 92/93, and pieces of semiconductor 94 are sandwiched between the metal electrodes 91 on the lower substrate 92 and the metal electrodes on the upper substrate 93. The Peltier junctions are formed between the metal electrodes 91 and the pieces of semiconductor 94. Power supply electrodes 94 are exposed to hollow space. The power supply electrodes 94 upwardly project from the lower substrate 92, and are supported by the upper substrate 93 as shown. In those modifications, the Peltier junctions are formed at high dense. More the Peltier junctions, more the heat is absorbed. Thus, more than two rows of Peltier junctions are desirable.

The invention claimed is:

1. A Peltier module comprising:
a first monolithic planar substrate having a first inner surface and a first outer surface reverse to said first inner surface;
a second planar substrate arranged in parallel to said first monolithic planar substrate, and having a second inner surface opposed to said first inner surface and a second outer surface reverse to said second inner surface;
said first monolithic planar substrate and said second planar substrate defining at least one open space through which a certain area on said first inner surface can be viewed in a direction perpendicular to said first monolithic planar substrate and said second planar substrate from positions on the side of said second planar substrate which are remote from said first monolithic planar substrate;
a plurality of electrodes selectively arranged on and contacting said first inner surface and said second inner surface so that the electrodes on said first inner surface form electrode pairs with the electrodes on said second inner surface;
a plurality of semiconductor elements associated with said electrode pairs, each of said semiconductor elements being connected to one of said electrode pairs so that said plurality of semiconductor elements and said electrode pairs form at least one series combination of Peltier junctions;
first and second power supply electrodes electrically coupled to first and second ones of said plurality of electrodes, respectively, and projecting from said certain area through said open space in said direction perpendicular to said first monolithic planar substrate and said second planar substrate so as to have contact surfaces spaced from said first inner surface by a distance equal to or greater than a distance between said first inner surface and said second outer surface; and
first and second conductive leads coupled to said contact surfaces so as to supply electric power from the outside of said Peltier module to said first and second power supply electrodes, respectively, and more flexible than said first and second power supply electrodes.

2. The Peltier module as set forth in claim 1, in which said first planar substrate is longer than said second planar substrate so that said certain area is defined on an end portion of said first inner surface.

3. The Peltier module asset forth in claim 1, in which at least two portions are cut away from said second planar substrate so that at least two sub-areas of said certain area are viewed from said positions in said direction perpendicular to said first and second planar substrates, and said first and second power supply electrodes project from said at least two sub-areas in said direction perpendicular to said first and second planar substrate, respectively.

4. The Peltier module as set forth in claim 1, in which said contact surfaces are substantially coplanar with said second outer surface.

5. The Peltier module as set forth in claim 1, in which said contact surfaces are spaced from said second outer surface so as to enter a space opposite to said first planar substrate with respect to said second planar substrate.

6. A Peltier module comprising:
a first planar substrate having a first inner surface and a first outer surface reverse to said first inner surface;
a second planar substrate arranged in parallel to said first planar substrate, and having a second inner surface opposed to said first inner surface and a second outer surface reverse to said second inner surface;
said first and second planar substrates defining at least one open space through which a certain area on said first inner surface can be viewed in a direction perpendicular to said first and second planar substrates from positions on the side of said second planar substrate which are remote from said first planar substrate;
a plurality of electrodes selectively arranged on said first inner surface and said second inner surface so that the electrodes on said first inner surface form electrode pairs with the electrodes on said second inner surface;
a plurality of semiconductor elements associated with said electrode pairs, each of said semiconductor elements being connected to one of said electrode pairs so that said plurality of semiconductor elements and said electrode pairs form at least one series combination of Peltier junctions;
first and second power supply electrodes electrically coupled to first and second ones of said plurality of electrodes, respectively, and projecting from said certain area through said open space in said direction perpendicular to said first and second planar substrates so as to have contact surfaces spaced from said first inner surface by a distance equal to or greater than a distance between said first inner surface and said second outer surface;
first and second conductive leads coupled to said contact surfaces, respectively, and more flexible than said first and second power supply electrodes; and
heat insulating layers inserted between said first and second power supply electrodes and said second planar substrate.

7. A Peltier module comprising:
a first monolithic substrate having a first inner surface;
a second substrate having a second inner surface opposed in parallel to said first inner surface and an outer surface reverse to said second inner surface, and shaped differently from said first monolithic substrate so that a certain area of said first inner surface is viewed from positions spaced from said outer surface oppositely to said first inner surface in a direction perpendicular to said first and second inner surfaces;
a series combination of Peltier junctions formed between said first monolithic substrate and said second substrate, and held in contact at both ends of said Peltier junctions with said first inner surface and said second inner surface;
power supply electrodes electrically connected to said series combination of Peltier junctions, formed on said certain area, projecting in parallel from said certain area over said second inner surface in said direction perpendicular to said first and second inner surfaces, and respectively having contact surfaces spaced from said first inner surface by a distance equal to or greater than a distance between said first inner surface and said outer surface; and
conductive leads respectively held in contact with said contact surfaces for supplying electric power from the outside of said Peltier module through said power supply electrodes to said series combination of Peltier junctions.

8. The Peltier module as set forth in claim 7, in which said conductive leads are more flexible than said power supply electrodes.

9. The Peltier module as set forth in claim 7, in which said first substrate is longer than said second substrate so that said certain area is defined on an end portion of said first inner surface.

10. The Peltier module as set forth in claim 7, in which at least two portions are cut away from said second substrate so that at least two sub-areas of said certain area are viewed from said positions in said direction perpendicular to said first and second inner surfaces, and said power supply electrodes project from said at least two sub-areas in said direction perpendicular to said first and second inner surfaces, respectively.

11. The Peltier module as set forth in claim 7, in which said contact surfaces are substantially coplanar with said outer surface.

12. The Peltier module as set forth in claim 7, in which said contact surfaces are spaced from said outer surface so as to enter a space opposite to said first substrate with respect to said second substrate.

13. A Peltier module comprising:
a first substrate having a first inner surface;
a second substrate having a second inner surface opposed in parallel to said first inner surface and an outer surface reverse to said second inner surface, and shaped differently from said first substrate so that a certain area of said first inner surface is viewed from positions spaced from said outer surface oppositely to said first inner surface in a direction perpendicular to said first and second inner surfaces;
a series combination of Peltier junctions formed between said first substrate and said second substrate, and held in contact at both ends of said Peltier junctions with said first inner surface and said second inner surface;
power supply electrodes electrically connected to said series combination of Peltier junctions, formed on said certain area, projecting in parallel from said certain area over said second inner surface in said direction perpendicular to said first and second inner surfaces, and respectively having contact surfaces spaced from said first inner surface by a distance equal to or greater than a distance between said first inner surface and said outer surface;
conductive leads respectively held in contact with said contact surfaces for supplying electric power to said series combination of Peltier junctions; and
heat insulating layers inserted between said power supply electrodes and said second substrate.

14. A peltier module comprising:
a first monolithic substrate having a first inner surface;
a second substrate having a second inner surface opposed to said first inner surface and an outer surface reverse to said second inner surface, and defining an open space extending from said first inner surface over said outer surface together with said first monolithic substrate;
Peltier junctions held in contact with said first inner surface and said second inner surface;
power supply electrodes electrically connected to said Peltier junctions, projecting upwardly from said first inner surface, and respectively having contact surfaces spaced from said first inner surface by a distance equal to or greater than a distance between said first inner surface and said outer surface; and
conductive leads respectively held in contact with said contact surfaces for supplying electric power from outside of said Peltier module to said power supply electrodes.

15. The Peltier module as sot forth in claim 14, in which said conductive leads are more flexible than said power supply electrodes.

16. The Peltier module as set forth in claim 14, in which said first substrate is longer than said second substrate so that said open space extends from an end portion of said first inner surface through said outer surface.

17. The Peltier module as set forth in claim 14, in which at least two portions are cut away from a said second substrate so that at least two areas on said first inner surface are viewed through at least two sub-spaces of said open space, and said power supply electrodes project from said at least two areas through said two sub-spaces.

18. The Peltier module as set forth in claim 14, in which said contact surfaces are substantially coplanar with said outer surface.

19. The Peltier module as set forth in claim 14, in which said contact surfaces are spaced from said outer surface so as to enter a space opposite to said first substrate with respect to said second substrate.

20. A Peltier module comprising:
a first substrate having a first inner surface;
a second substrate having a second inner surface opposed to said first inner surface and an outer surface reverse to said second inner surface, and defining an open space extending from said first inner surface over said outer surface together with said first substrate;
Peltier junctions held in contact with said first inner surface and said second inner surface;
power supply electrodes electrically connected to said Peltier junctions, projecting upwardly from said first inner surface, and respectively having contact surfaces spaced from said first inner surface by a distance equal to or greater than a distance between said first inner surface and said outer surface;
conductive leads respectively held in contact with said contact surfaces for supplying electric power to said power supply electrodes; and
heat insulating layers inserted between said power supply electrodes and said second substrate.

21. A Peltier module, comprising:
a first planar substrate having a first inner surface and a first outer surface;
a second planar substrate located above said first planar substrate and extending parallel to said first planar substrate, said second planar substrate having a second inner surface, opposed to said first inner surface, and second outer surface;
said first and second planar substrates defining at least one open area, as viewed in a direction perpendicular to said planar substrates, where said planar substrates do not overlap;
a plurality of electrodes formed at spaced locations on said first and second inner surfaces;
a plurality of semiconductor elements, each semiconductor element extending between a respective pair of said electrodes so as to form a plurality of series connected Peltier junctions; and
a power supply electrode electrically connected to one of said electrodes located on said first inner surface substrate, said power supply electrode located in one of said at least one open area and extending upwardly from said first inner surface toward said second inner surface in a direction perpendicular to said first planar substrate, said power supply electrode including a contact area adapted to be connected to a power line, said power supply electrode including a conductive portion which is in contact with one of said electrodes and a heat insulating portion in contact with said conductive portion.

22. The Peltier module as set forth in claim 21, in which said power supply electrode is insulated from said second planar substrate by said heat insulating portion.

23. The Peltier module as set forth in claim 22, wherein said heat insulated portion is in contact with said second planar substrate.

* * * * *